(12) United States Patent
Hu

(10) Patent No.: US 9,086,853 B2
(45) Date of Patent: Jul. 21, 2015

(54) CONNECTING MECHANISM AND RELATED ELECTRONIC DEVICE

(71) Applicant: Wistron Corporation, New Taipei (TW)

(72) Inventor: Po-Hung Hu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 43 days.

(21) Appl. No.: 13/721,022

(22) Filed: Dec. 20, 2012

(65) Prior Publication Data

US 2013/0182396 A1    Jul. 18, 2013

(30) Foreign Application Priority Data

Jan. 12, 2012    (TW) .............................. 101101216 A

(51) Int. Cl.
*G06F 1/16*    (2006.01)
*H05K 5/02*    (2006.01)

(52) U.S. Cl.
CPC .............. *G06F 1/1681* (2013.01); *G06F 1/162* (2013.01); *H05K 5/0226* (2013.01); *Y10T 16/53864* (2015.01)

(58) Field of Classification Search
CPC ............................ G06F 1/1681; H05K 5/0226
USPC ................. 361/728–747, 752–759, 796–802, 361/805–837; 455/575.1, 575.3, 575.54
See application file for complete search history.

(56) References Cited

U.S. PATENT DOCUMENTS

| | | | | |
|---|---|---|---|---|
| 5,494,447 A * | 2/1996 | Zaidan | ............................. | 439/31 |
| 6,134,103 A * | 10/2000 | Ghanma | .................. | 361/679.05 |
| 6,700,773 B1 * | 3/2004 | Adriaansen et al. | ..... | 361/679.08 |
| 6,826,043 B2 * | 11/2004 | Chang | ...................... | 361/679.27 |
| 7,237,755 B2 * | 7/2007 | Cho et al. | .................... | 248/274.1 |
| 7,239,505 B2 * | 7/2007 | Keely et al. | .............. | 361/679.09 |
| 7,404,233 B2 * | 7/2008 | Lu et al. | ........................... | 16/302 |
| 7,639,479 B2 * | 12/2009 | Chuang et al. | ........... | 361/679.06 |

(Continued)

FOREIGN PATENT DOCUMENTS

TW            M399579            3/2011

OTHER PUBLICATIONS

Office action mailed on Mar. 10, 2014 for the Taiwan application No. 101101216, filing date: Jan. 12, 2012, p. 2 line 2~26, p. 3 and p. 4 line 1~3.

(Continued)

*Primary Examiner* — Courtney Smith
*Assistant Examiner* — Rashen E Morrison
(74) *Attorney, Agent, or Firm* — Winston Hsu; Scott Margo

(57) ABSTRACT

A connecting mechanism of adjusting an angle of a first module relative to a second module of an electronic device is disclosed in the present invention. The connecting mechanism includes a hinge assembly disposed on the second module, a rod disposed on the hinge assembly and pivoting to the first module, a torsional spring disposed between the rod and the hinge assembly, and a damper assembly disposed on the rod and sheathed by the torsional spring. The hinge assembly includes a first hinge installed inside the second module, and a second hinge slidably disposed on the first hinge. The torsional spring drives the rod to rotate relative to the second hinge from a first position to a second position, so that the first module can stand on the second module. The damper assembly can be for absorbing a vibration generated from the rod.

20 Claims, 9 Drawing Sheets

(56) References Cited

U.S. PATENT DOCUMENTS

| | | | |
|---|---|---|---|
| 7,652,873 B2 * | 1/2010 | Lee | 361/679.06 |
| 7,751,195 B2 | 7/2010 | Barnett | |
| 8,050,024 B2 * | 11/2011 | Hsu et al. | 361/679.27 |
| 8,054,615 B2 * | 11/2011 | Lin et al. | 361/679.07 |
| 8,120,716 B2 * | 2/2012 | Vitito | 348/837 |
| 8,234,752 B2 * | 8/2012 | Anderson | 16/239 |
| 8,296,906 B2 * | 10/2012 | Wisniewski | 16/370 |
| 8,320,113 B2 * | 11/2012 | Xiao | 361/679.27 |
| 8,526,172 B2 * | 9/2013 | Dai et al. | 361/679.07 |
| 8,644,013 B2 * | 2/2014 | Chung et al. | 361/679.27 |
| 8,654,518 B2 * | 2/2014 | Wei | 361/679.02 |
| 2003/0090862 A1 * | 5/2003 | Hsiang | 361/681 |
| 2008/0161075 A1 * | 7/2008 | Kim et al. | 455/575.4 |
| 2008/0196201 A1 | 8/2008 | Anderson | |
| 2010/0053877 A1 | 3/2010 | Hsu | |
| 2010/0073857 A1 | 3/2010 | Lin | |
| 2011/0182011 A1 * | 7/2011 | Kim et al. | 361/679.01 |
| 2012/0162889 A1 * | 6/2012 | Han | 361/679.09 |
| 2012/0293938 A1 * | 11/2012 | Dai et al. | 361/679.07 |
| 2012/0300381 A1 * | 11/2012 | Hung et al. | 361/679.09 |
| 2013/0182396 A1 * | 7/2013 | Hu | 361/729 |

OTHER PUBLICATIONS

Office action mailed on Aug. 5, 2014 for the China application No. 201210024300.4, p. 3 line 4~43 and p. 4 line 1~41.

* cited by examiner

CONNECTING MECHANISM AND RELATED ELECTRONIC DEVICE

BACKGROUND OF THE INVENTION

1. Field of the Invention

The present invention relates to a connecting mechanism and a related electronic device, and more particularly, to a connecting mechanism having auto-rotating function and self-positioning function and a related electronic device.

2. Description of the Prior Art

A conventional portable electronic device, such as a notebook computer and a slide mobile phone, can rotate its upper casing relative to a low casing for adjusting the view angle of the panel module (the upper casing). The conventional portable electronic device generally includes various types of the connecting mechanism. One type of the conventional connecting mechanism includes a constraining component disposed between the upper casing and the low casing. Two edges of the constraining component respectively pivot to the upper casing and the low casing. The upper casing can not slide relative to the low casing by the conventional connecting mechanism due to constraint of the constraining component. The upper casing utilizes a resilient force of a torsional spring to rotate relative to a shaft of the constraining component, so as to stand on a surface of the low casing and to keep at the suitable view angle. The above-mentioned conventional connecting mechanism is applied to rotation with specific angles. An elevation angle of the upper casing relative to the low casing can not be adjusted according to user's demand.

The other type of the conventional connecting mechanism includes a slide mechanism disposed between the upper casing and the low casing, and the elevation angle of the upper casing is adjustable by the connecting mechanism with the slide mechanism. Operating procedures of the above-mentioned conventional connecting mechanism includes sliding the upper casing relative to the low casing in parallel for exposing an input device of the low casing, and moving the upper casing upwardly by hands. The upper casing can rotate from a position parallel to the low casing to a position sloping toward the low casing manually. The conventional connecting mechanism is inconvenient to manually rotate the upper casing relative to the low casing for adjusting the elevation angle. Therefore, design of a connecting mechanism having slide and pivot functions and capable of easily unfolding the upper casing relative to the low casing is an important issue in the mechanical industry.

SUMMARY OF THE INVENTION

The present invention provides a connecting mechanism having auto-rotating function and self-positioning function and a related electronic device for solving above drawbacks.

According to the claimed invention, a connecting mechanism is disclosed for adjusting an angle of a first module relative to a second module of an electronic device. The connecting mechanism includes a hinge assembly disposed on the second module. The hinge assembly includes a first hinge installed inside the second module, and a second hinge slidably disposed on the first hinge. The connecting mechanism further includes a rod disposed on the hinge assembly and pivoting to the first module, and a torsional spring disposed between the rod and the hinge assembly for rotating the rod relative to the second hinge from a first position to a second position when the second hinge slides relative to the first hinge over a predetermined value, so that the first module stands on the second module.

According to the claimed invention, the connecting mechanism further includes a damper assembly connected to the rod. The torsional spring is disposed on a body of the damper assembly, and the damper assembly absorbs vibration of the rod when the rod is rotated by the torsional spring.

According to the claimed invention, the hinge assembly includes a resilient component disposed between the first hinge and the second hinge for moving the second hinge relative to the first hinge.

According to the claimed invention, the hinge assembly is a slide hinge assembly.

According to the claimed invention, the connecting mechanism further includes a base disposed on the second hinge. The damper assembly is slidably disposed on the base.

According to the claimed invention, the base includes a supporting portion, a constraining slot is formed on a surface of the supporting portion, and the damper assembly is disposed inside the constraining slot.

According to the claimed invention, the damper assembly includes a shaft disposed on the base, an accommodating space is formed inside the shaft. The damper assembly further includes a bridging component movably disposed inside the accommodating space, and a damping component disposed inside the accommodating space and contacting against the bridging component.

According to the claimed invention, an end of the shaft is disposed inside the constraining slot, and the bridging component is connected to the rod.

According to the claimed invention, the connecting mechanism further includes a first axle disposed between the rod and the first module. An elevation angle of the first module relative to the rod is adjusted by the first axle.

According to the claimed invention, the connecting mechanism further includes a second axle disposed between the rod and the first module, the first module revolves round the rod by the second axle.

According to the claimed invention, an electronic device includes a first module, a second module, and a connecting mechanism disposed between the first module and the second module for adjusting an angle of the first module relative to the second module. The connecting mechanism includes a hinge assembly disposed on the second module. The hinge assembly includes a first hinge installed inside the second module, and a second hinge slidably disposed on the first hinge. The connecting mechanism further includes a rod disposed on the hinge assembly and pivoting to the first module, and a torsional spring disposed between the rod and the hinge assembly for rotating the rod relative to the second hinge from a first position to a second position when the second hinge slides relative to the first hinge over a predetermined value, so that the first module stands on the second module.

The connecting mechanism of the present invention has the auto-rotating function and the self-positioning function. The first module can be unfolded relative to the second module automatically by the torsional spring of the connecting mechanism when the hinge assembly is pushed over the predetermined value, so as to steady the first module at the optimum view angle. In addition, the connecting mechanism of the present invention can be further utilized to slightly adjust the elevation angle of the first module, and to reverse the first module from positive to negative. Thus, the electronic device of the present invention can be unfolded automatically by slight push of the first module, and utilize the damper assembly to absorb the vibration for preferable operation convenience.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
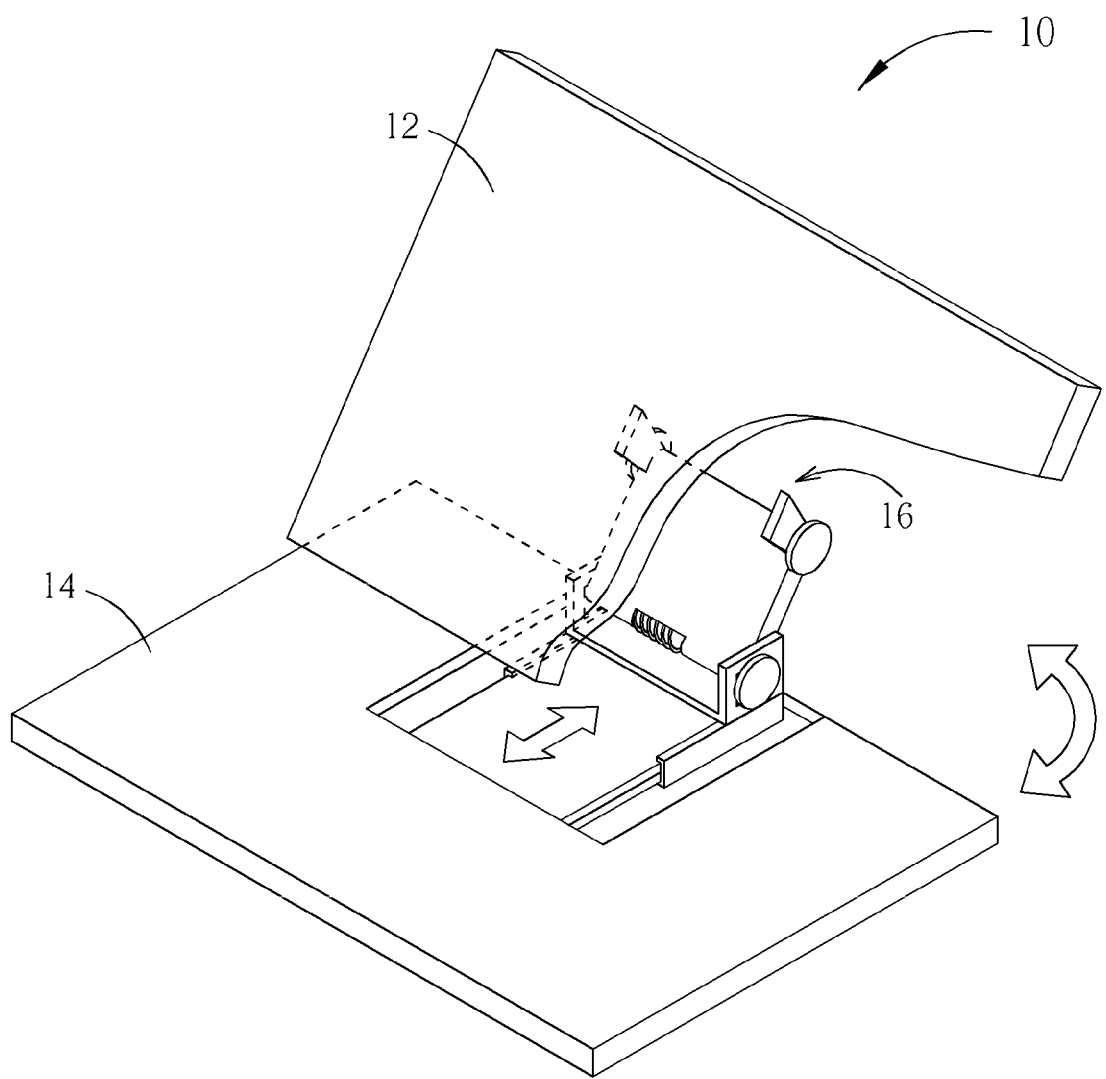
FIG. 1 is a diagram of an electronic device according to a first embodiment of the present invention.

Please refer to FIG. 1. FIG. 1 is a diagram of an electronic device 10 according to a first embodiment of the present invention. The electronic device 10 includes a first module 12, a second module 14 and a connecting mechanism 16. Generally, the electronic device 10 can be a notebook computer, a fold-type mobile phone, a portable device capable of folding and unfolding, and so on. The first module 12 can be a panel module, the second module 14 can be a host module, and the connecting mechanism 16 is connected between the first module 12 and the second module 14 for adjusting an elevation angle of the first module 12 relative to the second module 14. Therefore, a view angle of the panel module can be adjusted according to the user's demand. For example, the first module 12 can be unfolded to stand on the second module 14 for notebook computer operation, or can be folded to lie on the second module 14 for tablet computer operation.

Figure 2:
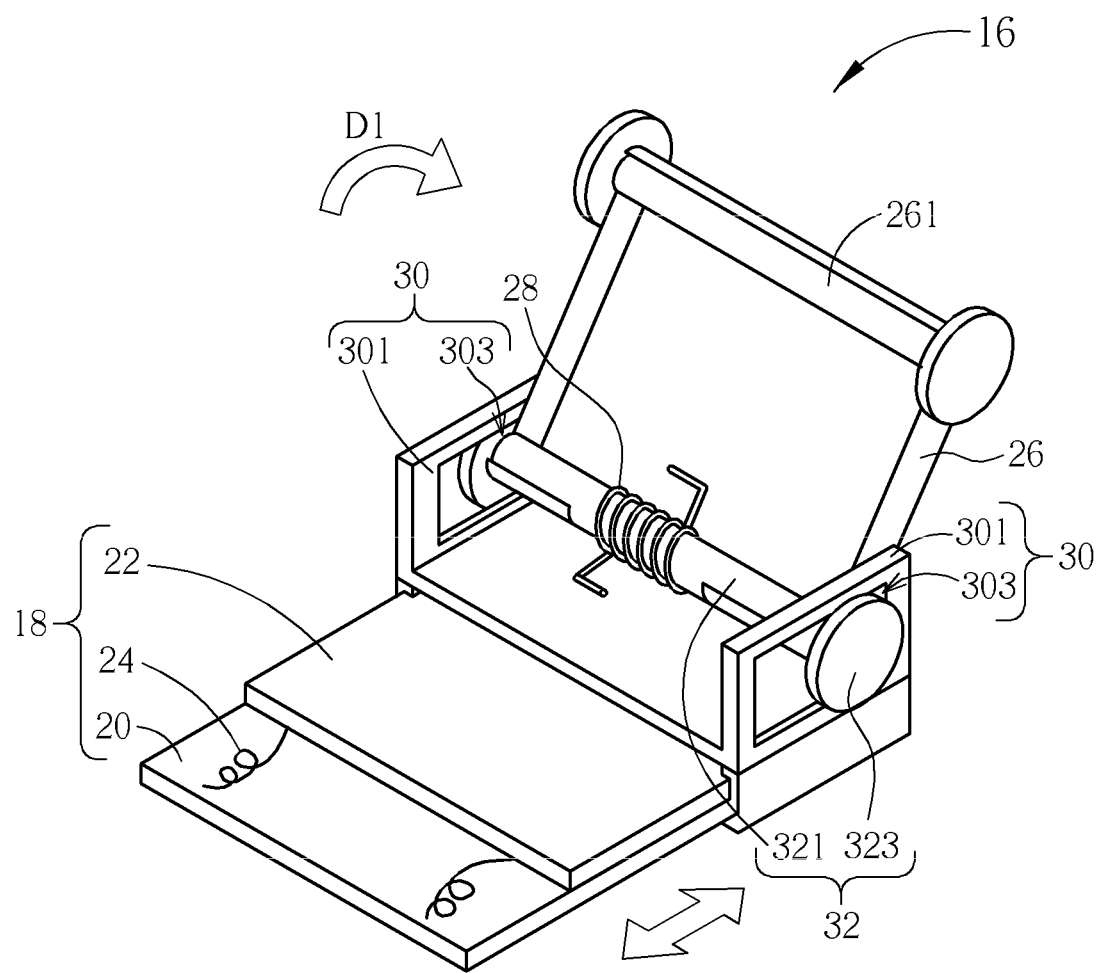
FIG. 2 is a diagram of a connecting mechanism according to the first embodiment of the present invention.

The connecting mechanism 16 of the present invention can be a slide linkage mechanism having auto-rotating function and self-positioning function. Please refer to FIG. 2. FIG. 2 is a diagram of the connecting mechanism 16 according to the first embodiment of the present invention. The connecting mechanism 16 includes a hinge assembly 18 disposed on the second module 14. The hinge assembly 18 includes a first hinge 20 installed inside a sunken structure on the second module 14, a second hinge 22 slidably disposed on the first hinge 20, and a resilient component 24 disposed between the first hinge 20 and the second hinge 22. As shown in FIG. 2, the hinge assembly 18 can be a slide hinge assembly. The second hinge 22 can be slightly pushed for moving relative to the first hinge 20, and the resilient component 24 can be actuated to provide a force for further moving the second hinge 22 relative to the first hinge 20 when a movement of the second hinge 22 relative to the first hinge 20 by manual push is over a predetermined value (threshold of the sliding distance). The hinge assembly 18 of the present invention can be opened easily, so as to adjust a parallel movement between the first module 12 and the second module 14.

As shown in FIG. 2, the connecting mechanism 16 further includes a rod 26 disposed on the hinge assembly 18 and pivoting between the first module 12 and the second module 14, a torsional spring 28 disposed between the rod 26 and the hinge assembly 18, a base 30 disposed on the second hinge 22, and a damper assembly 32 slidably disposed on the base 30 and located between the rod 26 and the torsional spring 28. The rod 26 can be a supporting component. An end of the supporting component pivots to the first module 12 via an axle 261, and the other end of the supporting component is connected to the second module 14 via the damper assembly 32, the base 30 and the hinge assembly 18. The rod 26 can support the first module 12, so as to stand the first module 12 on the second module 14. In addition, the base 30 can include two supporting portions 301. A constraining slot 303 can be formed on the supporting portions 301. Two ends of the damper assembly 32 can be movably disposed inside the corresponding constraining slot 303. A body 321 of the damper assembly 32 can be located between the supporting portions 301. Ends of the body 321 can respectively protrude from the corresponding supporting portions 301 through the constraining slot 303, and two constraining portions 323 of the damper assembly 32 can be connected to the ends of the body 321, which means the constraining portion 323 movably contacts an outer surface of the supporting portion 301 while the damper assembly 32 moves relative to the base 30 via the constraining slots 303, so as to prevent the damper assembly 32 from separation. The rod 26 can slightly move relative to the base 30 with the damper assembly 32 along the constraining slots 303 according to user's demand.

For adjusting the view angle of the first module 12 in simple operation, the torsional spring 28 can be actuated to rotate the rod 26 relative to the base 30 in a clockwise direction D1 shown in FIG. 2 when the second hinge 22 slides relative to the first hinge 20 over the predetermined value, which means the hinge assembly 18 stops sliding and the torsional spring 28 are driven to work the rod 26. As rotation of the rod 26, the first module 12 can move from a position lying on the second module 14 (an initial mode) to a position standing on the second module 14, so that the electronic device 10 can be switched from the tablet computer mode to the notebook computer mode.

Figure 3:
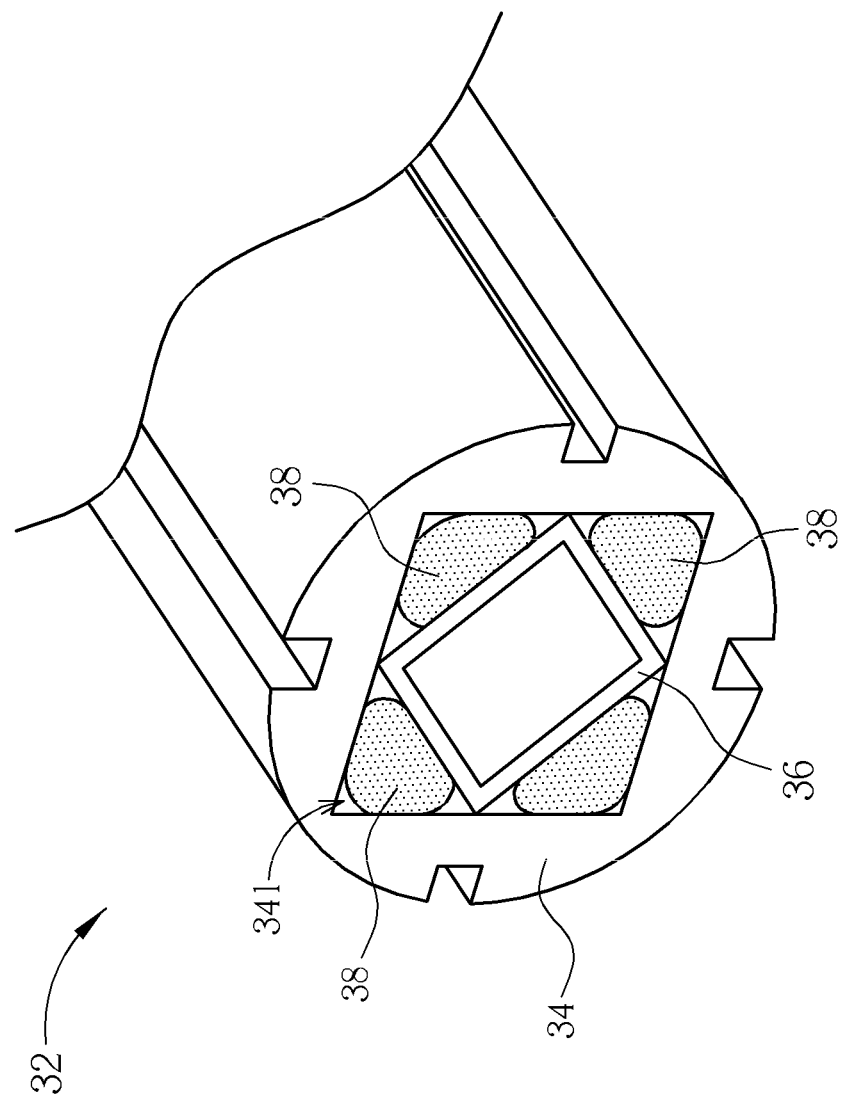
FIG. 3 is a sectional view of a damper assembly according to the first embodiment of the present invention.

It should be mentioned that the torsional spring 28 can be disposed on the body 321 of the damper assembly 32 and contact the rod 26 for reducing vibration of the first module 12 when the rod 26 is rotated by the torsional spring 28. The damper assembly 32 can effectively absorb vibration of the rod 26 (or the first module 12), and the vibration is generated by the unstable rotation of the rod 26. Please refer to FIG. 3. FIG. 3 is a sectional view of the damper assembly 32 according to the first embodiment of the present invention. The damper assembly 32 can include a shaft 34 disposed on the base 30. The shaft 34 can be a cannular component, which means an accommodating space 341 is formed inside the shaft 34. The damper assembly 32 can further include a bridging component 36 movably disposed inside the accommodating space 341 along an axial direction of the shaft 34, and a plurality of damping components 38 disposed between the shaft 34 and the bridging component 36. The accommodating space 341 can be filled with the damping components 38, and each damping component 38 can contact against an outer surface of the bridging component 36 tightly.

The shaft 34 can be the same element as the body 321 of the damper assembly 32. Two ends of the shaft 34 can be respectively disposed inside the corresponding constraining slot 303 with the constraining portion 323. The bridging component 36 can be connected to the rod 26, and the torsional spring 28 can put around the shaft 34. For example, the shaft 34 is sheathed with the torsional spring 28. An end of the torsional spring 28 can contact the rod 26, and the other end of the torsional spring 28 can contact the base 30 disposed on the hinge assembly 18. When the torsional spring 28 rotates the rod 26 relative to the base 30, the bridging component 36 can rotate relative to the shaft 34 with the rod 26, and meantime the shaft 34 does not rotate. Each damping component 38 is compressed by an inner surface of the shaft 34 and the outer surface of the bridging component 36, so as to absorb the vibration of the rod 26 by the resilient deformation, and to prevent the first module 12 from shaking relative to the second module 14 when the electronic device 10 is unfolded.

Figure 4:
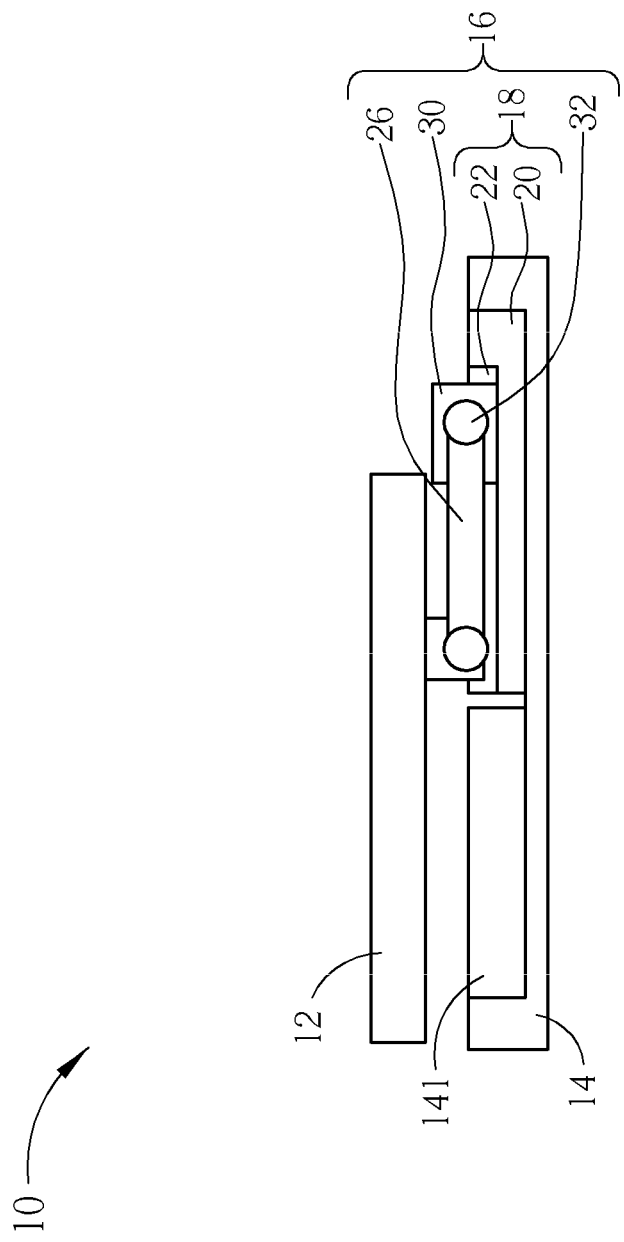
FIG. 4 to FIG. 6 respectively are diagrams of the electronic device in different operating modes according to the first embodiment of the present invention.
Figure 5:
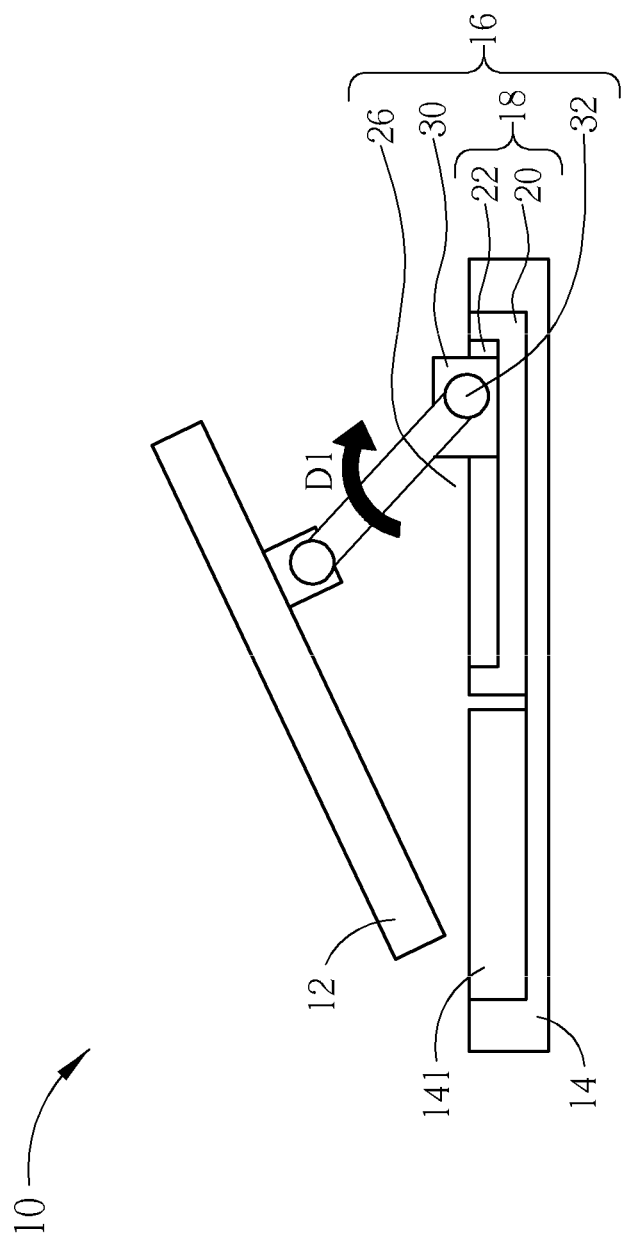
Figure 6:
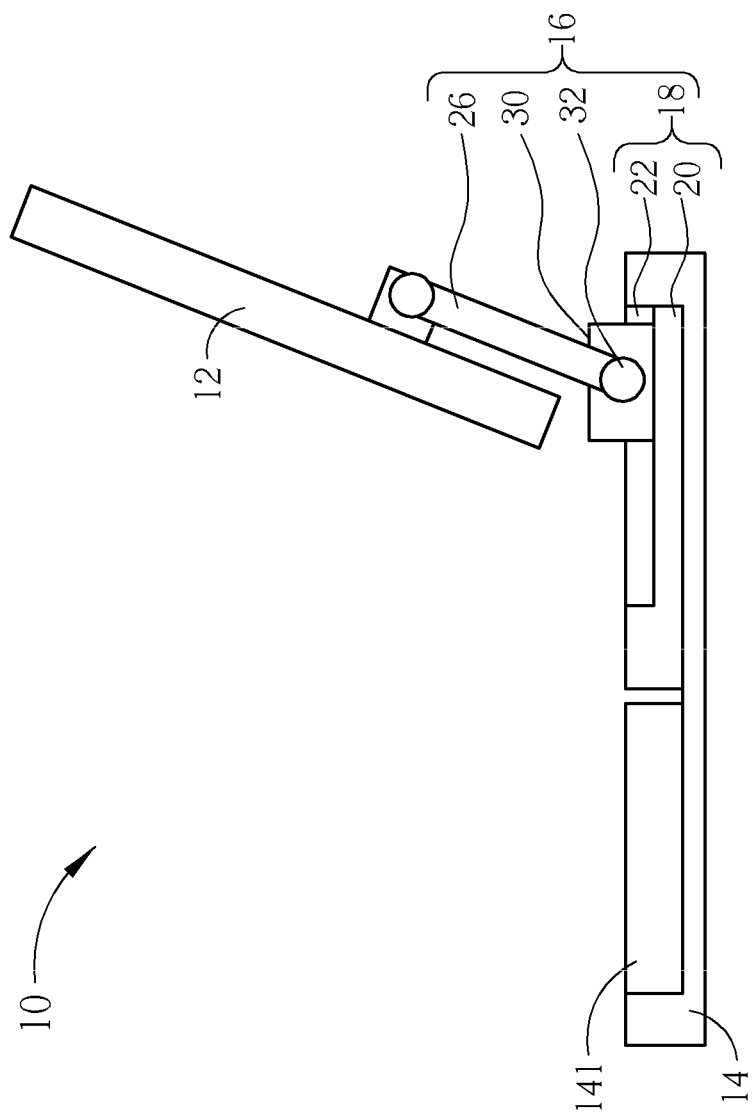

The first module 12 can stand on the second module 14 by pivot of the rod 26, so the first module 12 (the panel module) can rotate relative to the second module 14 (the host module) for forming the optimum view angle. Please refer to FIG. 4 to FIG. 6. FIG. 4 to FIG. 6 respectively are diagrams of the electronic device 10 in different operating modes according to the first embodiment of the present invention. The electronic device 10 is in an initial mode as shown in FIG. 4. The first module 12 lies on the surface of the second module 14, the rod 26 is at a first position, and the electronic device 10 can be closed or in the tablet computer mode. Further, the second hinge 22 can slide relative to the first hinge 20 in parallel for unfolding the first module 12. The torsional spring 28 can rotate the rod 26 along the clockwise direction D1 when the movement of the second hinge 22 relative to the first hinge 20 is over the predetermined value, as shown in FIG. 5. The rod 26 pushes an edge of the first module 12 upwardly, and the opposite edge of the first module 12 can move from an outer edge to an inner edge of the second module 14 due to the weight of the first module 12, so as to expose an input interface 141 of the second module 14. The input interface 141 can be a keyboard device. When the rod 26 rotates from the first position shown in FIG. 4 to a second position shown in FIG. 6 by the torsional spring 28, the first module 12 can stand above the second module 14 via the rod 26, and the predetermined view angle of the first module 12 can be designed according to rotation of the rod 26. Folding procedures is inverse operation of the above-mentioned unfolding procedures, and detailed description is omitted herein for simplicity.

Figure 7:
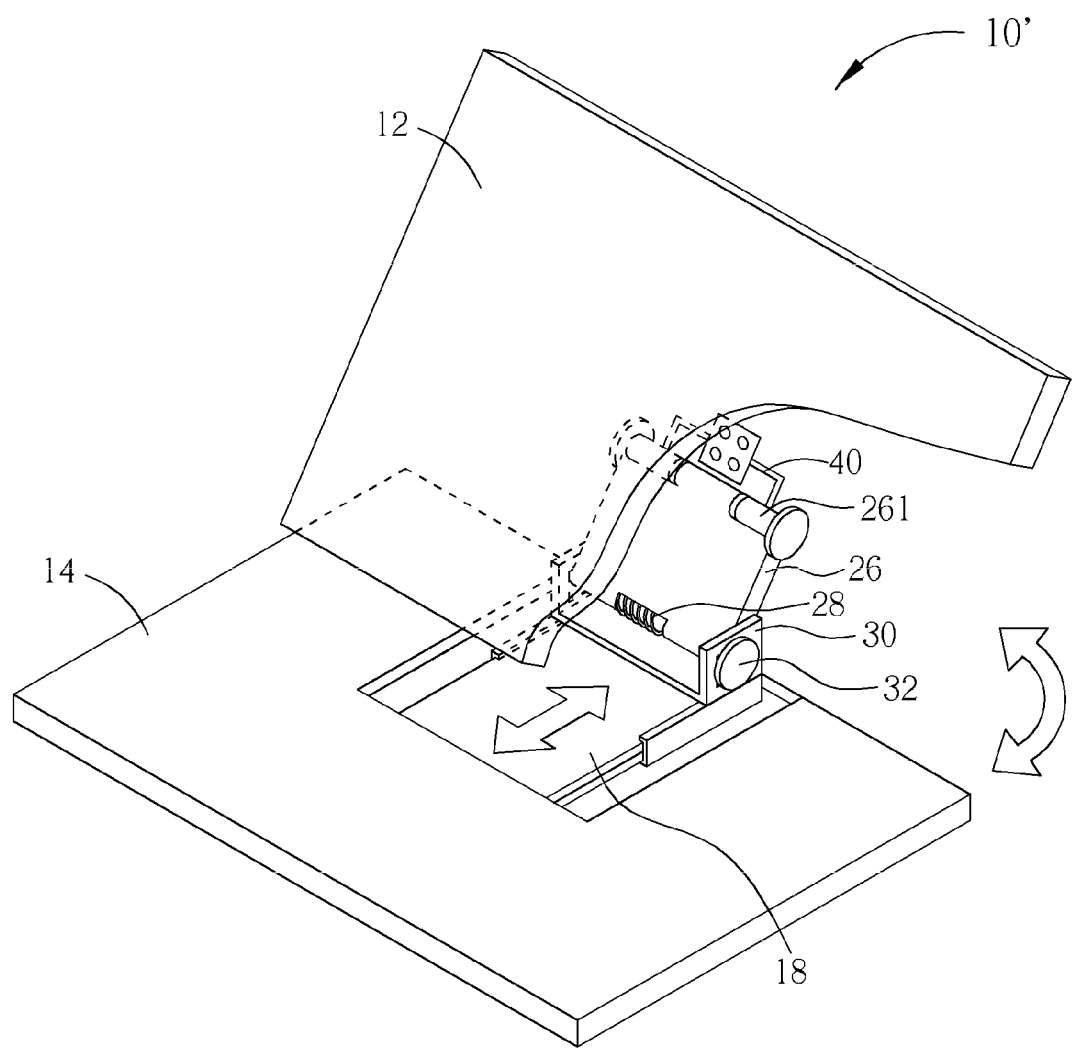
FIG. 7 is a diagram of an electronic device according to a second embodiment of the present invention.

Please refer to FIG. 7. FIG. 7 is a diagram of an electronic device 10' according to a second embodiment of the present invention. In the second embodiment, elements having the same numerals as ones of the first embodiment have the same structure and function, and detailed description is omitted herein for simplicity. Difference between the second embodiment and the first embodiment is that the connecting mechanism 16 of the electronic device 10' can further include a first axle 40 disposed between the rod 26 and the first module 12. The elevation angle of the first module 12 relative to the rod 26 along the axial direction of the axle 261 can be adjusted via the first axle 40. When the first module 12 of the electronic device 10' stands on the second module 14 by the torsional spring 28, a tiny rotation of the first module 12 relative to the second module 14 can be adjusted by the first axle 40, so as to choose the desirable view angle of the first module 12 (the panel module) according to user's demand.

Figure 8:
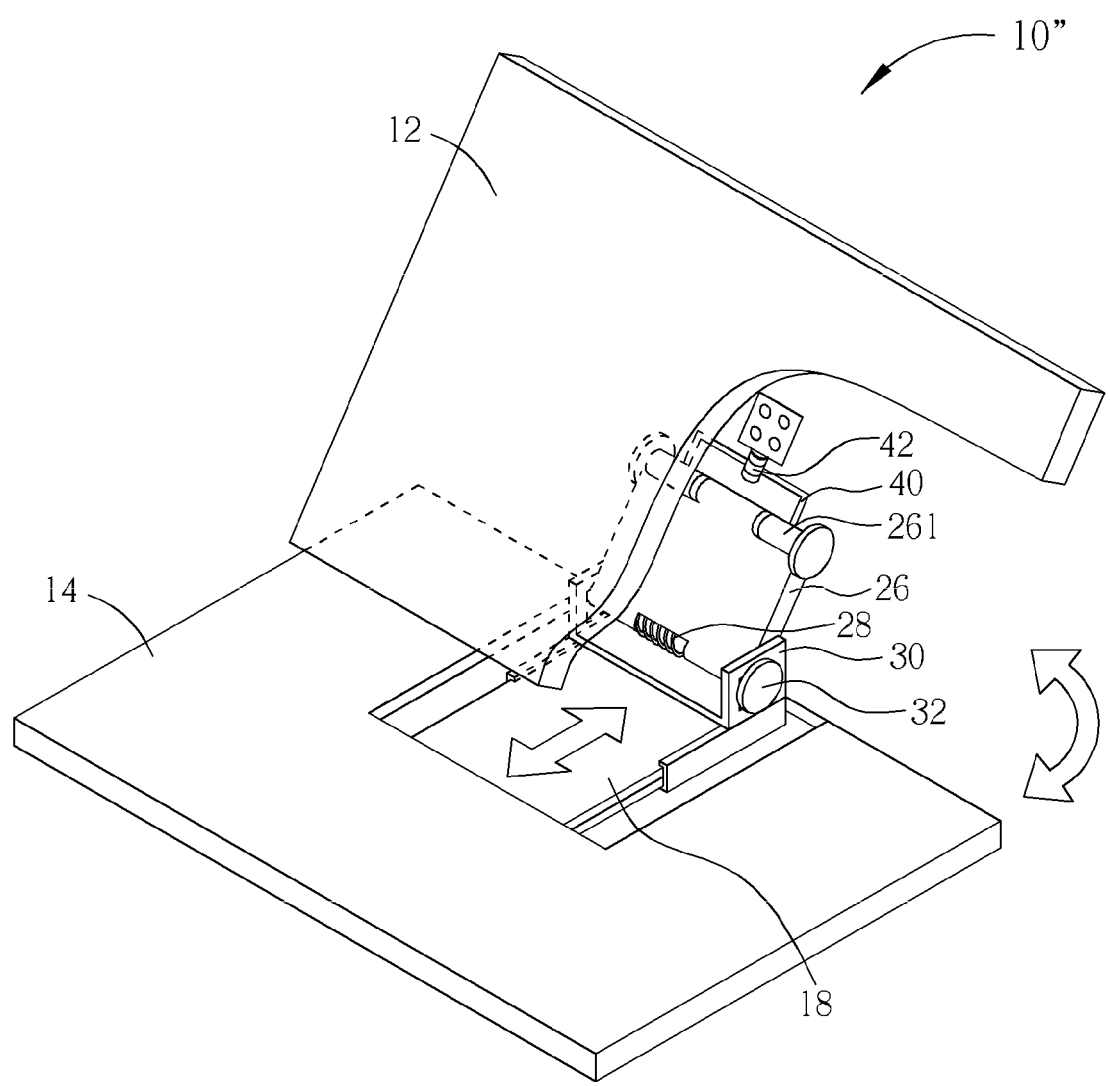
FIG. 8 is a diagram of an electronic device according to a third embodiment of the present invention.

Please refer to FIG. 8. FIG. 8 is a diagram of an electronic device 10" according to a third embodiment of the present invention. In the third embodiment, elements having the same numerals as ones of the above-mentioned embodiment have the same structure and function, and detailed description is omitted herein for simplicity. Difference between the third embodiment and the above-mentioned embodiment is that the connecting mechanism 16 of the electronic device 10" can further include the first axle 40 and a second axle 42. The second axle 42 can be disposed between the rod 26 and the first module 12, and can be connected to the first axle 40 for forming an axle kit. Due to the axle kit of the third embodiment, the first module 12 of the electronic device 10" not only can rotate along the axial direction of the first axle 40 for elevation angle adjustment, but also can revolve round the rod 26 via the second axle 42 for adjusting planer normal vector of the first module 12. It should be mentioned that the first axle 40 is utilized to adjust the elevation angle of the first module 12, and structural design depends on actual demand. For example, the first axle 40 can be omitted in case the electronic device 10" does not provide the elevation angle adjustment of the panel module.

Figure 9:
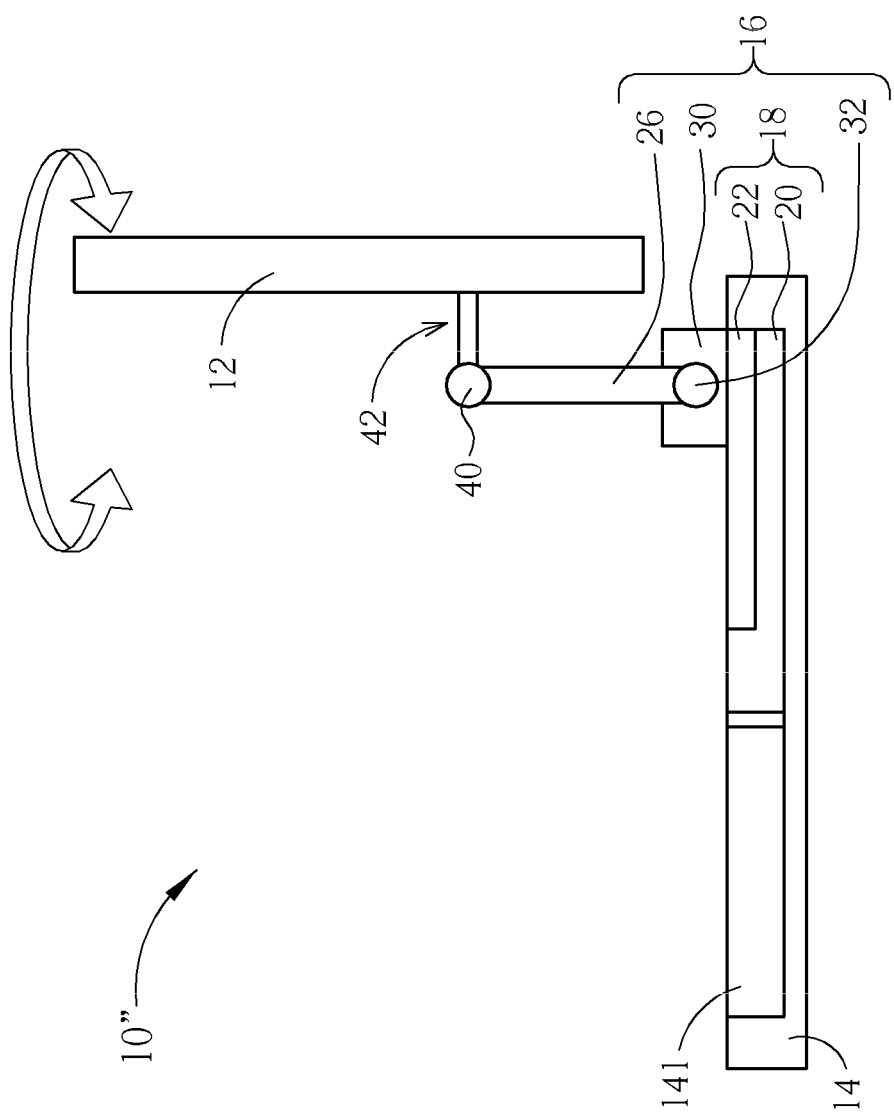
FIG. 9 is a sectional view of the electronic device according to the third embodiment of the present invention.

Please refer to FIG. 9. FIG. 9 is a sectional view of the electronic device 10" according to the third embodiment of the present invention. The initial position of the first module 12 faces the input interface 141 of the second module 14, and the first module 12 of the electronic device 10" can revolve round the rod 26 at 180 degrees for moving at a position shown in FIG. 9. A back of the first module 12 shown in FIG. 9 faces the input interface 141, so the view angle of the first module 12 can be adjusted accordingly. Therefore, the electronic device 10" of the third embodiment can utilize the connecting mechanism 16 to unfold the first module 12 relative to the second module 14 automatically, and then can further utilize the first axle 40 to adjust the view angle of the first module 12 and utilize the second axle 42 to reverse the first module 12 from positive to negative for multi-angle adjustment.

Comparing to the prior art, the connecting mechanism of the present invention has the auto-rotating function and the self-positioning function. The first module can be unfolded relative to the second module automatically by the torsional spring of the connecting mechanism when the hinge assembly is pushed over the predetermined value, so as to steady the first module at the optimum view angle. In addition, the connecting mechanism of the present invention can be further utilized to slightly adjust the elevation angle of the first module, and to reverse the first module from positive to negative. Thus, the electronic device of the present invention can be unfolded automatically by slight push of the first module, and utilize the damper assembly to absorb the vibration for preferable operation convenience.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A connecting mechanism capable of adjusting an angle of a first module relative to a second module of an electronic device, the connecting mechanism comprising:
   a hinge assembly disposed on the second module, the hinge assembly comprising:
      a first hinge installed inside the second module; and
      a second hinge slidably disposed on the first hinge;
   a rod, an end of the rod being rotatably and slidably disposed on the second hinge and the other end of the rod pivoting to the first module, the rod being adapted to move relative to the first hinge via the second hinge; and
   a torsional spring disposed between the rod and the hinge assembly for rotating the rod relative to the second hinge from a first position to a second position when the second hinge slides relative to the first hinge over a predetermined value, so that the first module stands on the second module.

2. The connecting mechanism of claim 1, further comprising:
   a damper assembly connected to the rod, the torsional spring being disposed on a body of the damper assembly, the damper assembly absorbing vibration of the rod when the rod is rotated by the torsional spring.

3. The connecting mechanism of claim 1, wherein the hinge assembly comprises:
a resilient component disposed between the first hinge and the second hinge for moving the second hinge relative to the first hinge.

4. The connecting mechanism of claim 1, wherein the hinge assembly is a slide hinge assembly.

5. The connecting mechanism of claim 2, further comprising:
a base disposed on the second hinge, the damper assembly being slidably disposed on the base.

6. The connecting mechanism of claim 5, wherein the base comprises a supporting portion, a constraining slot is formed on a surface of the supporting portion, and the damper assembly is disposed inside the constraining slot.

7. The connecting mechanism of claim 5, wherein the damper assembly comprises:
a shaft disposed on the base, an accommodating space being formed inside the shaft;
a bridging component movably disposed inside the accommodating space; and
a damping component disposed inside the accommodating space and contacting against the bridging component.

8. The connecting mechanism of claim 7, wherein an end of the shaft is disposed inside the constraining slot, and the bridging component is connected to the rod.

9. The connecting mechanism of claim 1, further comprising:
a first axle disposed between the rod and the first module, an elevation angle of the first module relative to the rod being adjusted by the first axle.

10. The connecting mechanism of claim 9, further comprising:
a second axle disposed between the rod and the first module, the first module revolving round the rod by the second axle.

11. An electronic device comprising:
a first module;
a second module; and
a connecting mechanism disposed between the first module and the second module for adjusting an angle of the first module relative to the second module, the connecting mechanism comprising:
a hinge assembly disposed on the second module, the hinge assembly comprising:
a first hinge installed inside the second module; and
a second hinge slidably disposed on the first hinge;
a rod, an end of the rod being rotatably and slidably disposed on the second hinge and the other end of the rod pivoting to the first module, the rod being adapted to move relative to the first hinge via the second hinge; and
a torsional spring disposed between the rod and the hinge assembly for rotating the rod relative to the second hinge from a first position to a second position when the second hinge slides relative to the first hinge over a predetermined value, so that the first module stands on the second module.

12. The electronic device of claim 11, wherein the connecting mechanism further comprises:
a damper assembly connected to the rod, the torsional spring being disposed on a body of the damper assembly, the damper assembly absorbing vibration of the rod when the rod is rotated by the torsional spring.

13. The electronic device of claim 11, wherein the hinge assembly further comprises:
a resilient component disposed between the first hinge and the second hinge for moving the second hinge relative to the first hinge.

14. The electronic device of claim 11, wherein the hinge assembly is a slide hinge assembly.

15. The electronic device of claim 12, wherein the connecting mechanism further comprises:
a base disposed on the second hinge, the damper assembly being slidably disposed on the base.

16. The electronic device of claim 15, wherein the base comprises a supporting portion, a constraining slot is formed on a surface of the supporting portion, and the damper assembly is disposed inside the constraining slot.

17. The electronic device of claim 15, wherein the damper assembly comprises:
a shaft disposed on the base, an accommodating space being formed inside the shaft;
a bridging component movably disposed inside the accommodating space; and
a damping component disposed inside the accommodating space and contacting against the bridging component.

18. The electronic device of claim 17, wherein an end of the shaft is disposed inside the constraining slot, and the bridging component is connected to the rod.

19. The electronic device of claim 1, wherein the connecting mechanism further comprises
a first axle disposed between the rod and the first module, an elevation angle of the first module relative to the rod being adjusted by the first axle.

20. The electronic device of claim 9, wherein the connecting mechanism further comprises:
a second axle disposed between the rod and the first module, the first module revolving round the rod by the second axle.

* * * * *